United States Patent
Bertin et al.

(10) Patent No.: US 6,239,649 B1
(45) Date of Patent: May 29, 2001

(54) SWITCHED BODY SOI (SILICON ON INSULATOR) CIRCUITS AND FABRICATION METHOD THEREFOR

(75) Inventors: Claude Louis Bertin, South Burlington; John Joseph Ellis-Monaghan, Grand Isle; Erik Leigh Hedberg, Essex Junction; Terence Blackwell Hook, Jericho, all of VT (US); Jack Allan Mandelman, Stormville, NY (US); Edward Joseph Nowak, Essex Junction, VT (US); Wilbur David Pricer, Charlotte, VT (US); Minh Ho Tong; William Robert Tonti, both of Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/295,124

(22) Filed: Apr. 20, 1999

(51) Int. Cl.$^7$ .................................. G05F 3/02; H03K 3/01
(52) U.S. Cl. .......................... 327/534; 327/535; 326/33; 326/34
(58) Field of Search ..................................... 327/534, 535, 327/536, 537; 326/112, 119, 31, 33, 34

(56) References Cited

U.S. PATENT DOCUMENTS

| | | | |
|---|---|---|---|
| 4,612,461 | 9/1986 | Sood | 326/7 |
| 4,791,316 | 12/1988 | Winnerl et al. | 327/545 |
| 4,809,056 | 2/1989 | Shirato et al. | 357/71 |
| 5,045,716 | 9/1991 | Takacs et al. | 327/534 |
| 5,103,277 | 4/1992 | Caviglia et al. | 357/23.7 |
| 5,157,279 | * 10/1992 | Lee | 326/34 |
| 5,185,535 | 2/1993 | Farb et al. | 257/351 |
| 5,191,244 | * 3/1993 | Rundaldue et al. | 326/33 |
| 5,317,181 | 5/1994 | Tyson | 257/347 |
| 5,341,034 | 8/1994 | Matthews | 327/534 |
| 5,422,583 | 6/1995 | Blake et al. | 327/94 |
| 5,461,338 | 10/1995 | Hirayama et al. | 327/534 |
| 5,546,020 | 8/1996 | Lee et al. | 326/83 |
| 5,550,486 | * 8/1996 | Sweeney et al. | 326/14 |
| 5,552,723 | * 9/1996 | Shigehara et al. | 326/86 |
| 5,557,231 | 9/1996 | Yamaguchi et al. | 327/534 |
| 5,594,371 | 1/1997 | Douseki | 326/119 |
| 5,602,790 | 2/1997 | Mullarkey | 365/211 |
| 5,608,344 | 3/1997 | Marlow | 327/206 |
| 5,610,533 | 3/1997 | Arimoto et al. | 326/33 |
| 5,612,643 | * 3/1997 | Hirayama | 327/534 |
| 5,748,029 | * 5/1998 | Tomasini et al. | 327/534 |
| 5,939,936 | * 8/1999 | Beiley et al. | 327/534 |
| 5,966,043 | * 10/1999 | Jinbo | 327/534 |

\* cited by examiner

*Primary Examiner*—Timothy P. Callahan
*Assistant Examiner*—An T. Luu
(74) *Attorney, Agent, or Firm*—John J. Goodwin

(57) ABSTRACT

Circuits with SOI devices are coupled to a body bias voltage via a switch for selectively connecting the body bias voltage signals to the SOI device body. NMOS or PMOS SOI devices are used for the switched body SOI device and a FET is used for the switch and the gate terminal of the SOI device is connected to the FET device. The gate of the SOI device controls the FET switch connection of the body bias voltage signals to the SOI device to adjust the threshold value of the SOI device. Logic circuits incorporating the SOI devices are also disclosed, and the fabrication process for the SOI devices as well.

10 Claims, 11 Drawing Sheets

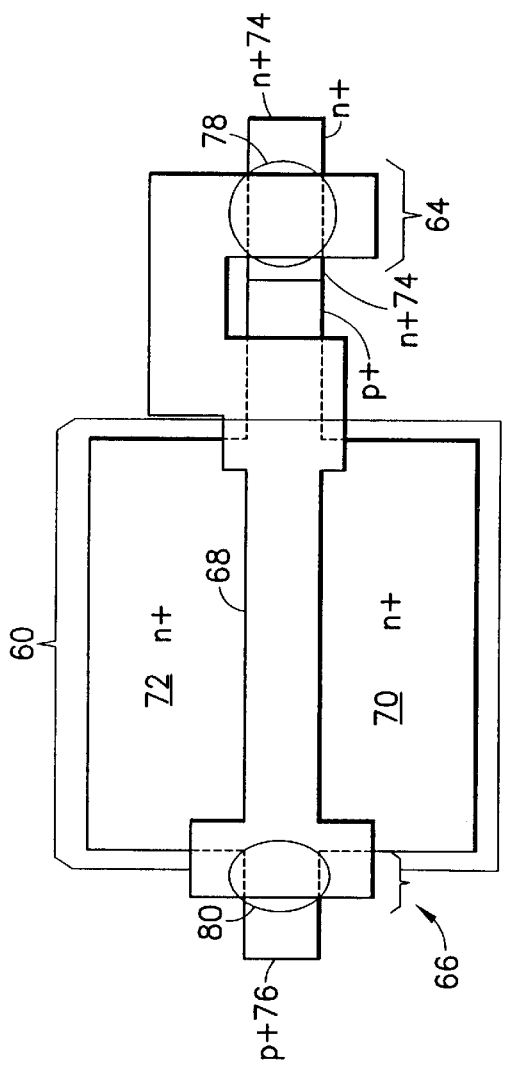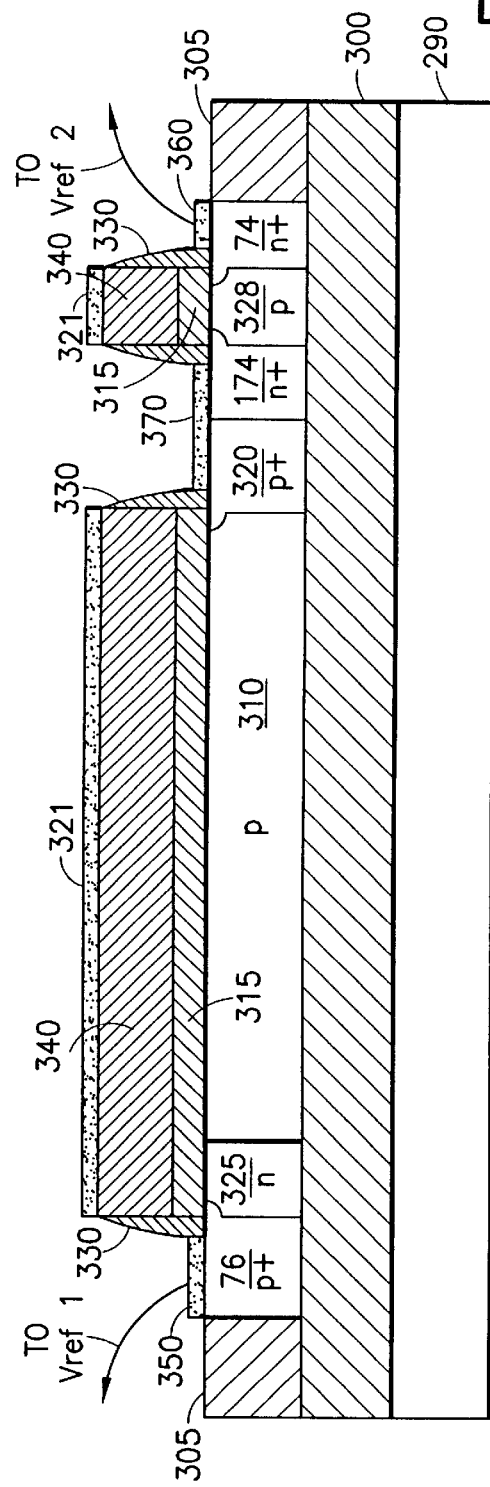

SWITCHED BODY SOI (SILICON ON INSULATOR) CIRCUITS AND FABRICATION METHOD THEREFOR

BACKGROUND OF THE INVENTION

1. Field of the Invention

The present invention relates to means for dynamically altering the threshold voltage of Silicon-On-Insulator (SOI) transistors, and more particularly to the application of SOI transistor unit cells in large scale integrated logic circuits to provide high performance, low power integrated circuits incorporating SOI transistor devices with adjustable threshold voltages.

2. Background Art

It is known that threshold voltages of SOI devices can be altered by changing the body-source bias potential. References that relate generally to adjusting the bias voltage of CMOS devices or to SOI devices and their application are as follows.

U.S. Pat. No. 5,610,533 issued to Arimoto et al. discloses a semiconductor circuit that converts body bias potential between first and second values for MOS-FET logic circuits.

U.S. Pat. No. 5,608,344 issued to Marlow discloses an analog double-throw switch that connects the body of a FET to either a first voltage or a second voltage.

U.S. Pat. No. 5,557,231 issued to Yamaguchi et al. discloses a semiconductor device in combination with a first bias voltage generating circuit for generating a first substrate bias voltage value for reducing power consumption in the standby state and a second bias voltage generating circuit for generating a second substrate bias voltage value for increasing operating speed in the active state.

U.S. Pat. No. 5,552,723 to Shigehara et al. discloses a body bias switch for MOSFET devices with two N channel FETs, one with a common gate with the FET being controlled, the other FET with a gate controlled by the complement of the signal at the gate of the FET being controlled.

U.S. Pat. No. 5,461.338 issued to Hirayama et al. discloses a circuit with a plurality of transistors on a substrate and a bias voltage generating circuit for providing a low threshold bias voltage in the active state for high speed operation and a high threshold bias voltage for power consumption the standby state.

U.S. Pat. No. 4,809,056 to Shirato et al. discloses a technique for fabricating an improved contact region of a SOI structure.

U.S. Pat. No. 5,185,535 to Farb et el. discloses separately controllable and independent back bias for adjacent CMOS transistors fabricated on SOI substrates.

Other background references include U.S. Pat. No. 5,594,371 to Douseki, U.S. Pat. No. 5,602,790 to Mullarkey, U.S. Pat. No. 5,546,020 to Lee et al., U.S. Pat. No. 5,317,181 to Tyson, U.S. Pat. No. 5,422,583 to Blake et al., U.S. Pat. No. 4,612,461 to Sood, U.S. Pat. No. 4,791,316 to Winnerl et al., U.S. Pat. No. 5.045,716 to Takacs et al., U.S. Pat. No. 5,103,277 to Caviglia et al., and U.S. Pat. No. 5,341,034 to Matthews.

SUMMARY OF THE INVENTION

Current CMOS technology continues to scale lower voltages and smaller dimensions. Presently there exists 3.5 volt and 2.5 volt operation, and 1.8 volt operation is anticipated. However, the scaling of threshold voltage is becoming increasingly difficult. If threshold voltage is not scaled with power supply voltage, then the performance is effected because of low active current. If the threshold voltage is scaled to low values, the transistors exhibit a high leakage current in the off state. In addition, data shows that alpha particle sensitivity increases with lower voltage, making it more difficult to design stable logic functions, shift register latches and memory storage cells.

One solution is to change from bulk CMOS devices to devices in Silicon On Insulator (SOI) substrates. SOI substrates exhibit lower alpha particle sensitivities because of smaller capture cross sections. However, impact ionization results in greater overall alpha particle sensitivity above 1.75 volts. Below 1.75 volts, alpha particle sensitivity relative to bulk CMOS decreases significantly because of the large reduction of impact ionization, which can be one or more orders of magnitude differences at 0.75 volts.

An object of the present invention is to provide switched body SOI CMOS circuits having an FET device that is switched from a floating body condition to a bias condition to raise the FET device threshold voltage after switching.

Another object of the present invention is to provide a switched body SOI CMOS circuit with circuit control of FET device wells for increased on/off current ratio.

Still another object of the present invention is to provide a switched body SOI unit cell structure in which the gate terminal of an FET controls the connection of the body bias to the FET body.

A further object of the present invention is to provide a switched body SOI device that has a low threshold voltage level in the active switching state and a high threshold voltage level in the standby state.

A still further object of the present invention is to provide a switched body SOI unit cell structure wherein the source-body voltage is controlled separately during different operating regimes of SOI FET devices.

A still further object of the present invention is to provide switched body SOI CMOS unit cell structures having FET devices with threshold voltage levels that can be altered by changing the body source potential.

Still another object of the present invention is to provide switched body SOI devices that have a low threshold voltage level in the active switching state and a high threshold voltage level in the standby state.

Still another object of the present invention is to provide switched body SOI unit cell structures that are switched between a low voltage level floating body condition to a bias condition that raises the threshold voltage level after switching.

A further object of the present invention is to provide an switched body SOI unit cell structures wherein the source-body voltage is controlled separately during different operating regimes of SOI FET devices.

A still further object of the present invention is to provide an improved method of fabricating an SOI device according to the principles of the present invention.

Still another object of the present invention is to provide a complementary pass gate logic circuit including SOI unit cells according to the principles of the present invention.

Still another object of the present invention is to provide a latch circuit including SOI unit cells according to the principles of the present invention.

Other features, advantages and benefits of the present invention will become apparent in the following description taken in conjunction with the following drawings. It is to be understood that the foregoing general description and the following detailed description are exemplary and explanatory but are not to be restrictive of the invention. The accompanying drawings which are incorporated in and constitute a part of this invention and, together with the description, serve to explain the principles of the invention in general terms. Like numerals refer to like parts throughout the disclosure.

BRIEF DESCRIPTION OF THE DRAWINGS

FIGS. 15 through 25 are top view and side view illustrations that show the various steps in a process for fabricating an SOI transistor unit cell according to the principles of the present invention.

DETAILED DESCRIPTION OF THE INVENTION

The present invention employs SOI devices, particularly NFET or PFET SOI CMOS devices in combination with switches that may also be NFET or PFET devices to provide unit cells that may be employed in integrated circuits.

A typical SOI device has a relatively thick insulator layer composed, for example, of silicon dioxide disposed beneath a single crystal layer and patterned to provide a (p+, n−, p+) or a (n+, p−, n+) semiconductor device.

Figure 1:
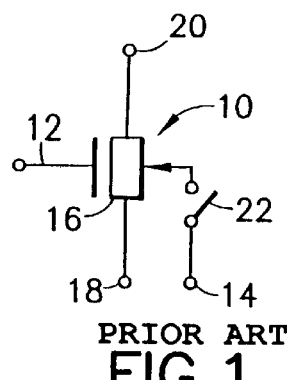
FIGS. 1 and 2 are schematic illustrations of basic NFET and a PFET device configurations respectively for switched body SOI circuits with a gate controlled switch for connecting body bias signals to the device.
Figure 2:
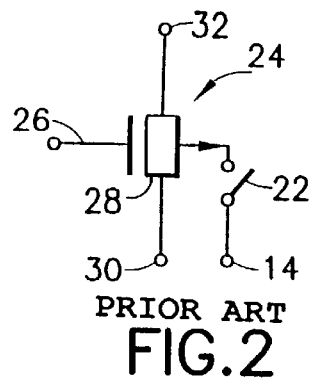

Referring to FIG. 1 a basic circuit of the present invention is shown in which the gate terminal 12 of SOI NFET device 10 also controls the connection of a body bias voltage 14 to the SOI NFET device body 16 by means of a gate controlled switch 22. In FIG. 2 an SOI PFET device 24 is shown with a similar gate terminal 26, body bias voltage 14 and gate controlled switch 22. In FIG. 1 the NFET device source terminal is designated 18 and the drain terminal is designated 20. In FIG. 2 the PFET device source terminal is 30 and the drain terminal is 32.

In a first operating mode, gate controlled switch 22 can be set to be closed when SOI NFET device 10 of FIG. 1 (or SOI PFET device 24 of FIG. 2) turns on and can be set to be open when NFET device 10 (or PFET device 24) is off. In a second operating mode gate controlled switch 22 can be open when NFET device 10 (or PFET device 24) is o n and closed when NFET device 10 (or PFET device 24) is off. In the first mode the body bias 14 voltage would be set to a potential value that lowers the threshold voltage of NFET device 10 (or PFET device 24) during switching, and in the second mode the body bias voltage 14 would be set to a potential value that raises the threshold voltage of NFET device 10 (or PFET device 24) when NFET device 10 (or PFET device 24) is off. In the circuits of FIGS. 1 and 2, one implementation is to obtain the body bias voltage by a connection to the device source terminal. In another implementation, the body bias voltage can be obtained by a connection to a power supply.

Figure 3:
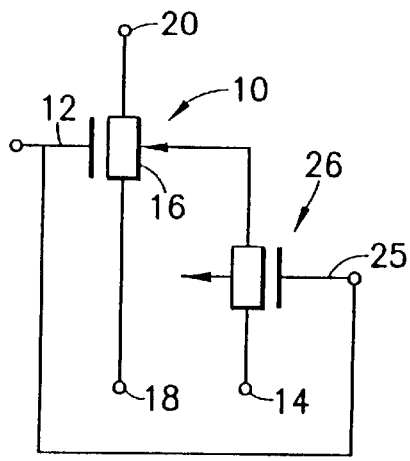
FIGS. 3 and 4 are schematic illustrations of NMOS and PMOS device unit cell configurations respectively for switched body SOI circuits wherein the gate terminal controls the switch connection of body bias signals to the device.

Referring to FIG. 3, an embodiment of the invention is shown including SOI NFET device 10 and wherein the gate controlled switch 22 shown in FIG. 1 is embodied as a PFET device 26 having source and drain diffusion regions connected between body bias voltage 14 and the body 16 of NFET device 10. PFET device 26 is switched by having its gate terminal 25 connected to the gate terminal 12 of NFET device 10. In FIG. 3 the body bias voltage 14 is connected to the body 16 of NFET device 10 by PFET device 26 when NFET device 10 is off.

Figure 4:
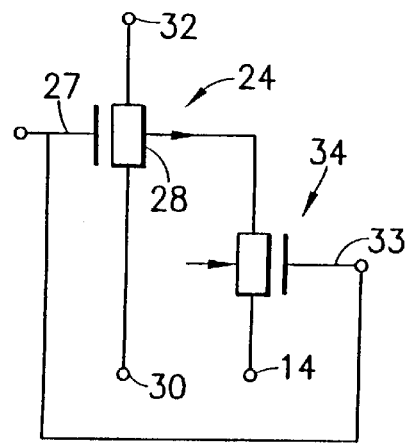

Referring to FIG. 4, an embodiment of the invention is shown including an SOI PFET device 24 and wherein the gate controlled switch 22 of FIG. 2 is embodied as an NFET device 34 having source and drain diffusions connected between the body bias voltage 14 and the body 28 of PFET device 24. NFET device 34 is switched by having its gate terminal 33 connected to the gate terminal 27 of PFET device 24. In FIG. 4 the body bias voltage 14 is connected to the body 28 of PFET device 24 by NFET device 34 when PFET device 24 is off.

Figure 5:
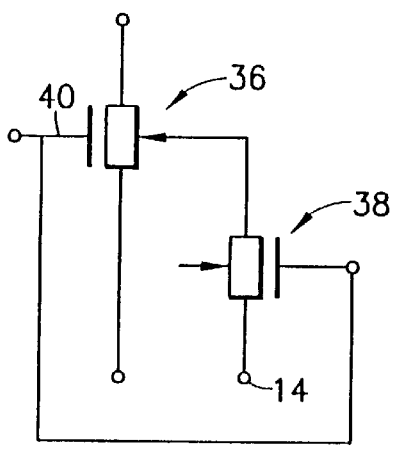
FIGS. 5 and 6 are schematic illustrations of NFET and PFET unit cell configurations respectively for CMOS switched body SOI circuits wherein the gate terminal controls the switch connection of body bias signals to the device.
Figure 6:
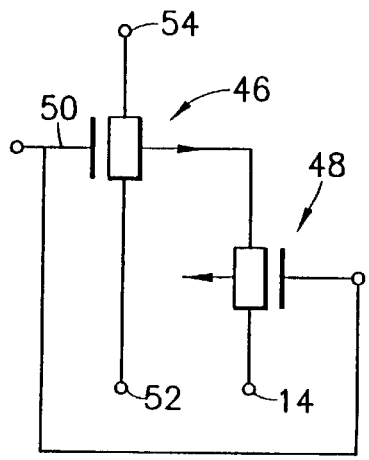

Referring to FIG. 5, an embodiment of the invention is shown including an SOI NFET device 36 and wherein the gate controlled switch 22 of FIG. 1 is embodied as an NFET device 38 that is switched by its connection to the gate terminal 40 of NFET device 36. In FIG. 5 the body bias voltage 14 is connected to the body of NFET device 36 by NFET device 38 when NFET device 36 is on. Referring to FIG. 6, an embodiment of the invention is shown including a SOI PFET device 46 and wherein the gate controlled switch 22 of FIG. 2 is embodied as a PFET device 48 that is switched by its connection to the gate terminal 50 of PFET device 46. In FIG. 6 the body bias voltage 14 is connected to the body of PFET device 46 by PFET device 48 when PFET device 46 is on.

The circuits shown and described in FIGS. 1 through 6 are embodied as MOSFET devices, however the present invention may also be embodied using other transistor types (like JFETs and MESFETs) for any and/or all the transistor elements.

Figure 7:
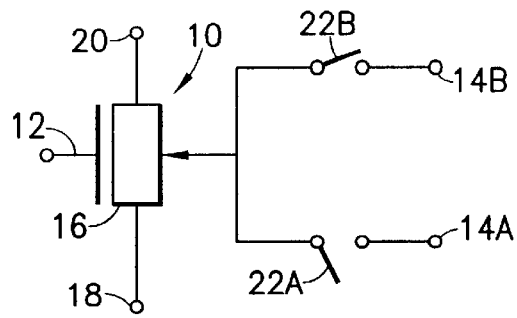
FIG. 7 is a schematic illustration of an embodiment of a transistor unit cell according to the present invention, employing a switched body S01 NFET transistor circuit having two switches connected to two bias level signals respectively.

The present invention is not limited to the use of just one source of body bias voltage as shown in FIGS. 1 through 6. Referring to FIG. 7, the NFET device 10 of FIG. 1 is shown in combination with two sources of body bias signal 14A and 14B. Body bias signal 14A is connected to body 16 via a gate controlled switch 22A (i.e. controlled by a signal from gate 12) that is normally open. Likewise, body bias signal 14B is connected to body 16 via normally closed gate controlled switch 22B.

Figure 8:
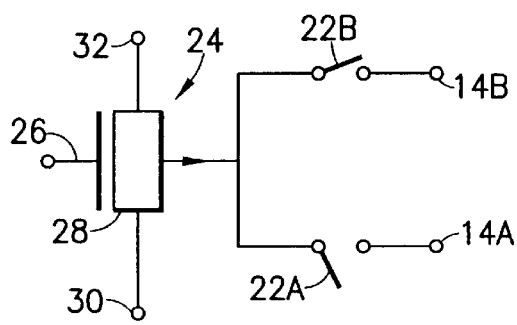
FIG. 8 is a schematic illustration of an embodiment of a transistor unit cell according to the present invention, employing a switched body SOI NFET transistor circuit having two switches connected to two bias level signals respectively.

In FIG. 8, the PFET version is shown wherein body 28 of PFET transistor 24 is connected to body bias signal 14A via normally open gate controlled switch 22A. Likewise, body bias signal 14B is connected to body 28 of PFET 24 via normally closed gate controlled switch 22B.

The switching function of the transistor unit cells shown in FIGS. 1 through 8 is not limited to being controlled by the device gate, but can also be can be controlled by circuits as shown in the embodiments of FIGS. 9, 10, 11 and 12.

Figure 9:
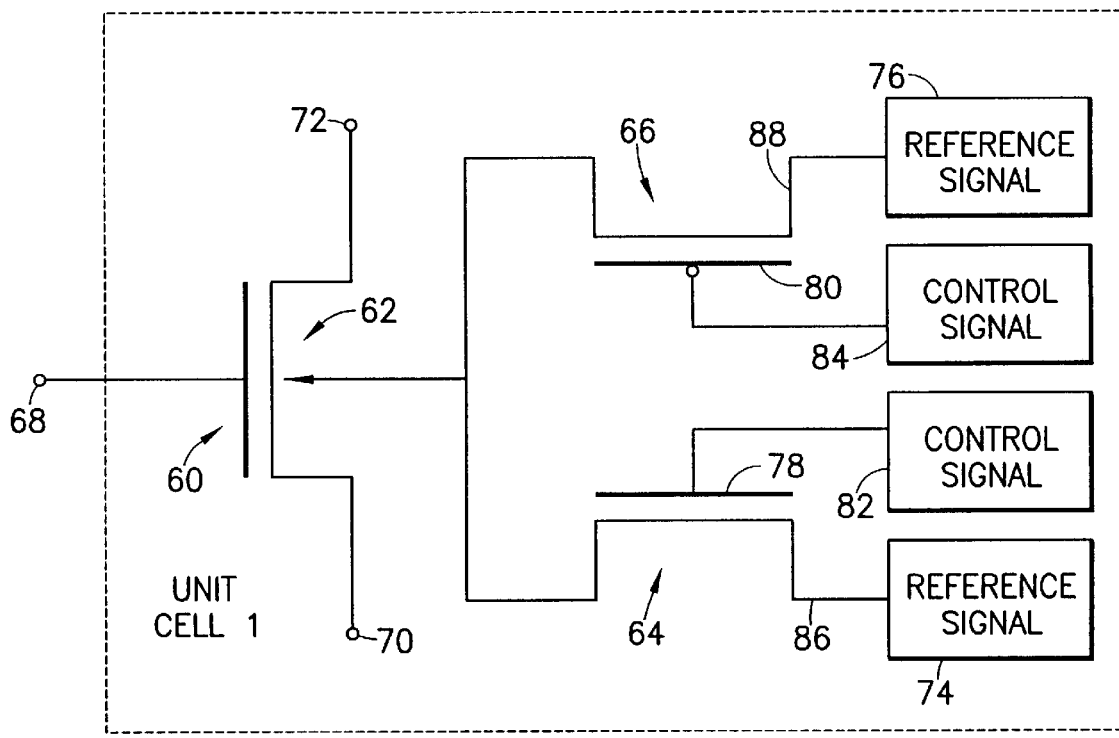
FIG. 9 is a schematic illustration of an embodiment of a transistor unit cell employing an SOI transistor circuit according to the present invention.

Referring to the circuit of FIG. 9, which will be referred to as unit cell 1, an embodiment of a unit cell is illustrated including SOI NMOS transistor 60 having its body, or isolated SOI substrate region 62 connected to body bias transistor switches 64 and 66. Transistor switch 64 is connected to reference signal 74, which is applied to the body 62 of transistor 60 when transistor switch 64 is operated by the control signal 82 connected to its gate 78.

Likewise, body 62 of transistor 60 is connected to reference signal 76 via bias transistor switch 66, which is operated by a control signal 84 applied to its gate 80.

In FIG. 9, transistors 60 and 64 are shown as a NMOS devices and transistor 66 is a PMOS device. Transistor 60 may also be a PMOS device. The source 70 and drain 72 of transistor 60 are tailored for high performance using known techniques.

Reference signals 74 and 76 may be high or low level voltages depending on whether transistor 60 is selected to be an NMOS or PMOS transistor and the circuit application with which the unit cell is used.

Figure 10:
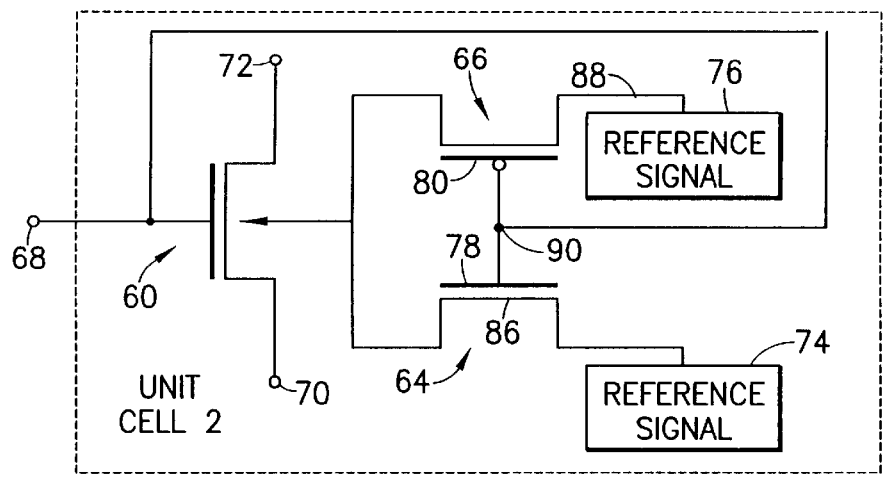
FIG. 10 is a schematic illustration of another embodiment of a transistor unit cell using an SOI transistor circuit according to the principles of the present invention.

Referring to FIG. 10, another embodiment of the invention is shown which will be referred to as unit cell 2. The difference between unit cell 1 of FIG. 9 and unit cell 2 of FIG. 10 is that in unit cell 2 the gate 78 of transistor switch 64 and the gate 80 of transistor switch 66 are connected by node 90 back to the gate of NFET SOI transistor 60. Transistor switches 64 and 66 are thus operated by the signal on the gate of NFET SOI transistor 60.

In FIG. 10, NMOS transistor 60 is in an isolated SOI region. NMOS transistor 64 is in a p type region, isolated from the SOI substrate, and controls the voltage on the substrate of transistor 60 when the gate voltage of transistor 64 is positive or high. PMOS transistor 66 is in an n type region, isolated from the SOI substrate, and controls the voltage on the substrate of transistor 60 when the gate voltage of transistor 66 is negative or low.

Figure 11:
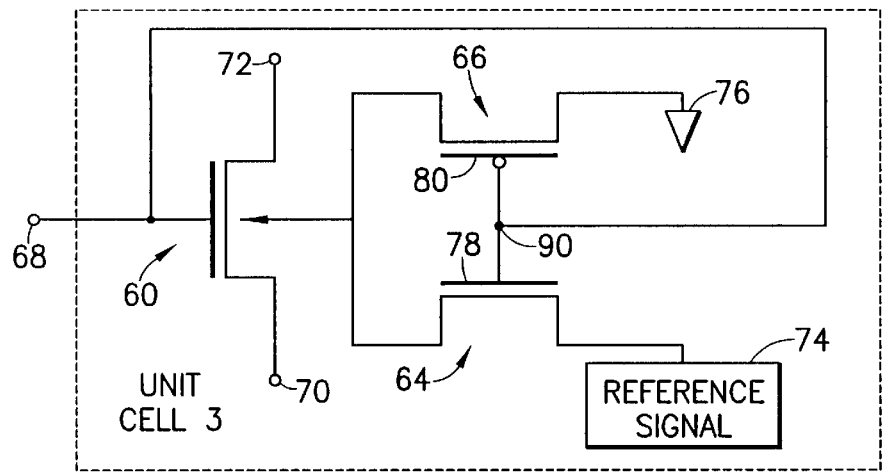
FIG. 11 is a schematic illustration of still another embodiment of a transistor unit cell using an SOI transistor circuit according to the principles of the present invention.
Figure 12:
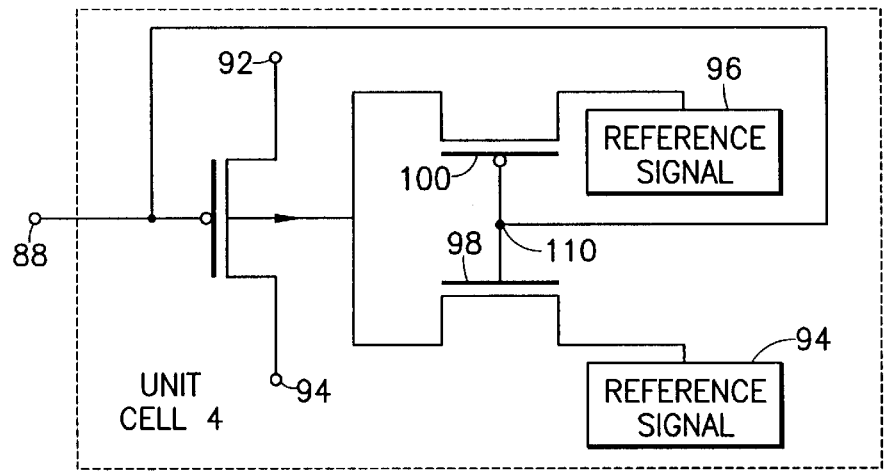
FIG. 12 is a schematic illustration of a still further embodiment of a transistor unit cell using an SOI transistor circuit according to the principles of the present invention.

FIG. 11, which illustrates an embodiment of the invention that will be referred to as unit cell 3, is the same as the unit cell 2 of FIG. 10 except that reference signal 76 connected to transistor switch 66 is ground potential FIG. 12 illustrates an embodiment of the invention that will be referred to as unit cell 4. Unit cell 4 is the same as unit cell 2 of FIG. 10 except that SOI transistor 60 of FIG. 10 is a PFET transistor in unit cell 4 of FIG. 12.

As previously stated, the transistor unit cells of the present invention can be integrated into logic, shift register and memory applications to provide fast, low power alpha particle insensitive circuits.

Figure 13:
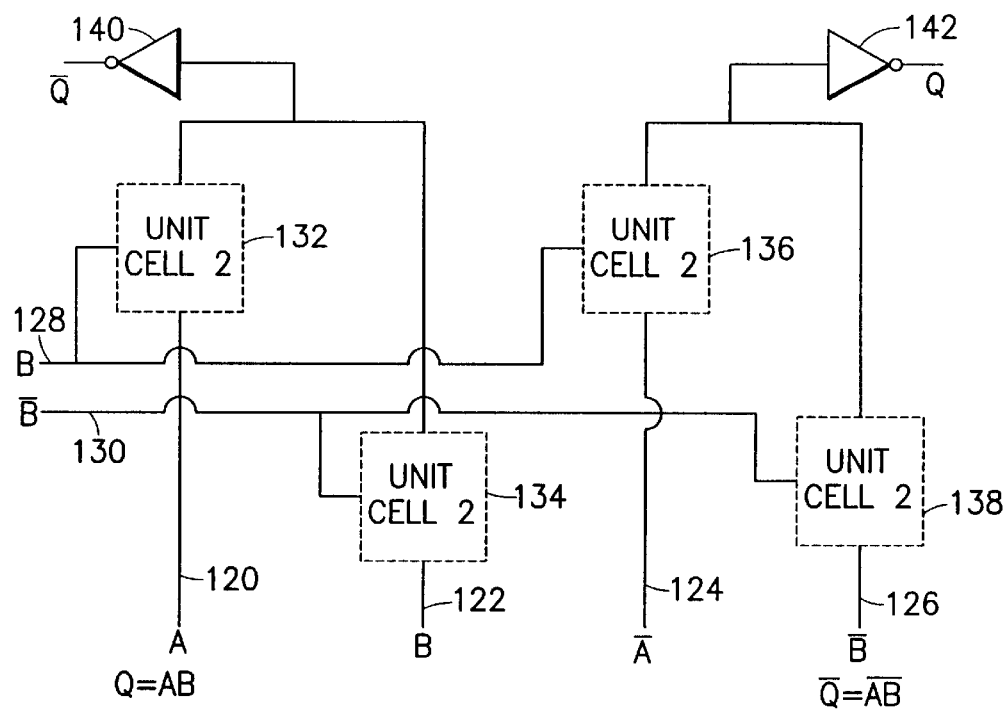
FIG. 13 is an illustration of an embodiment of a complementary pass gate logic circuit employing SOI transistor unit cells according to the principles of the present invention.

Referring to FIG. 13, an embodiment is provided wherein the unit cell 2 of FIG. 10 is incorporated in a complementary pass gate logic circuit. The pass gate circuit has six input leads 120, 122, 124, 126, 128, and 130 connected to logic signals A, B, NOT A, NOT B, B, and NOT B respectively. A first unit cell 132 is connected to logic signals A and B on leads 120 and 128 respectively. Leads 120 and 128 are connected inside unit cell 2 to leads 68 and 70 in FIG. 10, and lead 72 in FIG. 10 is connected to output inverter 140 in FIG. 13. A second unit cell 134 is connected to logic signals B and NOT B on leads 122 and 130 respectively. A third unit cell 136 is connected to logic signals NOT A and B on leads 124 and 128 respectively and a fourth unit cell 138 is connected to logic signals NOT B and NOT B on leads 126 and 130 respectively.

An inverter buffer circuit 140 combines the outputs of unit cells 132 and 134 to provide an output logic signal NOT Q as the complement of the product of A and B. A second inverter buffer circuit 142 is connected to unit cells 136 and 138 to provide an output logic signal Q as the product of logic signals A and B.

The complementary pass gate logic circuit of FIG. 13 that incorporates the low threshold SOI switching transistors can be used for low voltage, small scale dimension integrated circuit applications. The logic circuit is also alpha particle radiation insensitive at this low voltage operation.

The circuit of FIG. 13 using the unit cells 2 of FIG. 10 has several advantages over prior art complementary pass gate logic circuits. By tying reference signal 76 to a forward bias voltage of approximately 0.4 volts and tying reference signal 74 to a voltage below ground (for example minus 0.5 volts, the current carrying NFETs 60 can be switched through an effective overdrive range that exceeds the overdrive the FET would normally be subject to. For example, an NFET could see a threshold voltage (Vt) change of about 150 mvolts (in going from 0.4 to −0.5 of body voltage) which would be a significant overdrive change when the circuit is operating at low voltage. Thus, pass transistor circuits other than the specific embodiment shown in FIG. 13 benefit from employing unit cells of the present invention at low power supplies.

A pass transistor circuit that does not employ the unit cells of the present invention will lose its speed benefits when the voltage is lowered because several drops in Vt may be necessary to make the circuit operate correctly. In the present invention, when the pass transistor is on, Vt is low, allowing for several Vt drops within the circuit. When the pass transistor is off, the Vt is high, preventing additional leakage currents and giving good noise immunity.

Another advantage of the use of the present invention in the circuit of FIG. 13 is that the body switching behavior permits operation at a much lower power supply voltage for the same change in overdrive (Vgs−Vt). For example, using the unit cells permits operation below 0.6 Vdd. Since active power is proportional to Vdd squared, this allows the power supply to be lowered and the Vdd benefit to be obtained while maintaining the current carrying capability of a higher power supply voltage. In the embodiment of the present invention the body coupled FETs, such as device 60 for example, would be optimized to have high substrate sensitivity, thus enhancing the substrate control of the threshold voltage swing. The larger (greater than 150 mVolts) change in Vt would provide a significant performance gain depending upon how low a power supply voltage is chosen.

Figure 14:
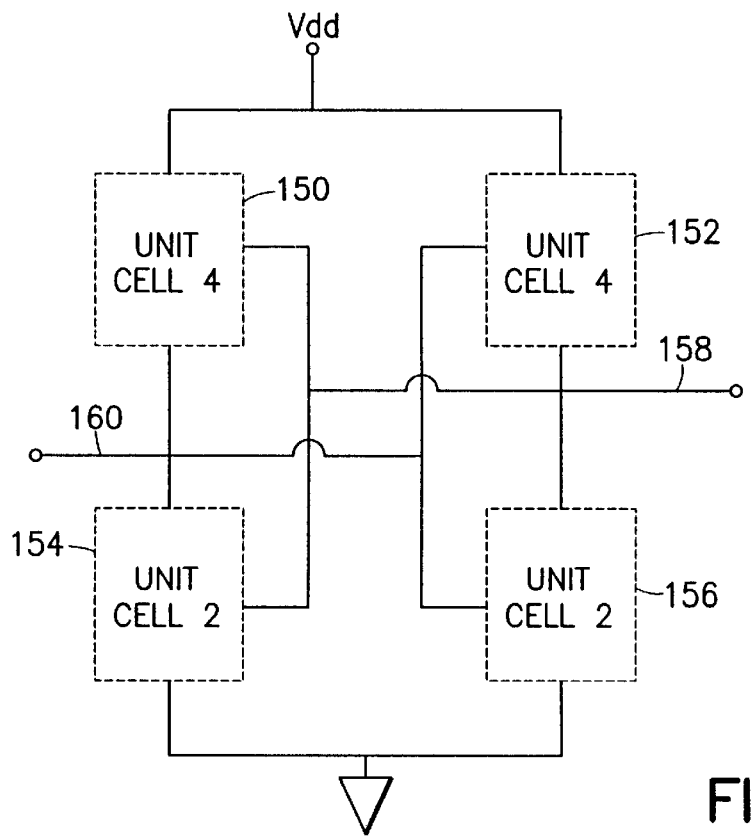
FIG. 14 is an illustration of an embodiment of a latch circuit employing SOI transistor unit cells according to the principles of the present invention.

Referring to FIG. 14, another logic circuit application of the unit cell of the present invention is illustrated. In FIG. 14, a circuit is provided including four unit cells 150, 152, 154 and 156 connected between voltage Vdd and ground to provide a latch function. Unit cells 150 and 154 are connected to a latching signal on lead 158 and unit cells 152 and 156 are connected to a latching signal on lead 160.

A preferred embodiment would have unit cell 4 (devices 150 and 152 of FIG. 14) with reference signal 96 of FIG. 12 tied to ground and reference signal 94 of FIG. 12 tied to Vdd. In addition, unit cell 2 (devices 154 and 156 of FIG. 14) would have reference signal 76 of FIG. 10 tied to ground and reference signal 74 tied to Vdd. This implementation would be valuable at very low voltages with Vdd near 0.6 volts. For Vdd less than 0.6 volts, the high reference voltage would be above Vdd and the low reference voltage could be below ground, For Vdd greater than 0.6 volts, the high reference voltage would be below Vdd.

The latch circuit of FIG. 14 is also applicable in low voltage, small scale dimension applications where alpha particle insensitivity is important.

The advantages of the use of unit cells of the present invention in the latch circuit of FIG. 14 are similar to those of FIG. 13. In FIG. 14, both NFET and PFET devices with body control are employed. During operation of the latch circuit of FIG. 14, the change in substrate bias also changes the Vt. In addition, this change in Vt also enhances the stability of the latch circuit. As a result, at low voltage operation the circuit of FIG. 14 can latch with more stability than prior art circuits operating at very low Vdd voltage. Furthermore, when the latch circuit is used in large arrays, the high Vt of the devices when "off" reduces the standby power consumption.

FIGS. 13 and 14 show the use of unit cells of the present invention in two logic circuits. Other logic circuits will benefit from their use as well. For example the publication Top-Down Pass Transistor Logic Design, IEEE J. Solid State Circuits. Vol. 31, No. 6 pp 792–803, June 1996 shows a complementary pass transistor design and several other pass transistor circuits that could also benefit by employing the unit cells of the present invention instead of pass transistors as shown.

Referring to FIGS. 15, 16, 17, 18, 19, 20, 21, 22, 23 24 and 25, top view and side view schematic illustrations are provided showing various steps in the method of fabricating the switched body SOI devices of the present invention using three FETs of the type shown in FIG. 10.

Figure 15:
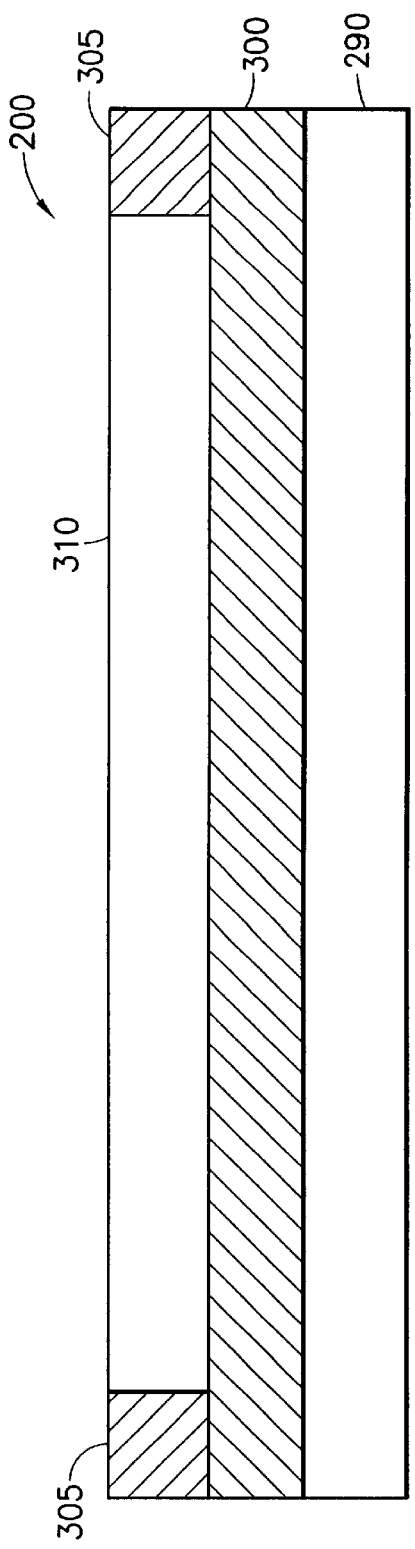
Figure 16:
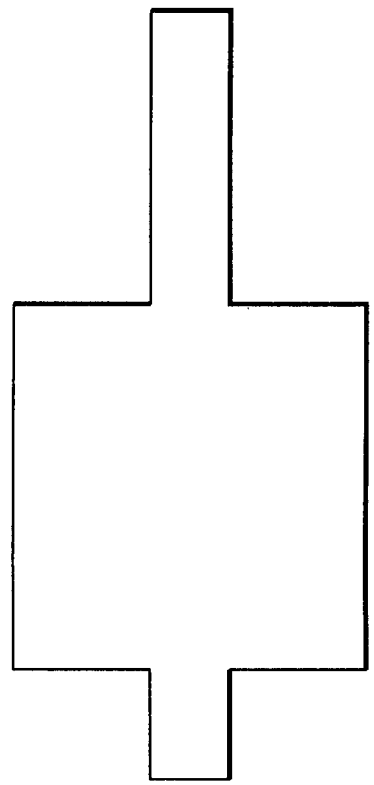

FIG. 15 is a side view showing the first step in the the fabrication of a unit cell such as shown in FIG. 10. An SOI wafer 200 including a silicon substrate 290, oxide layer 300 and silicon layer 310 has oxide regions 305 formed using standard trench isolation process steps. FIG. 16 shows a top view of the configuration of the oxide isolation boundary layer in the first step of the process.

Figure 17:
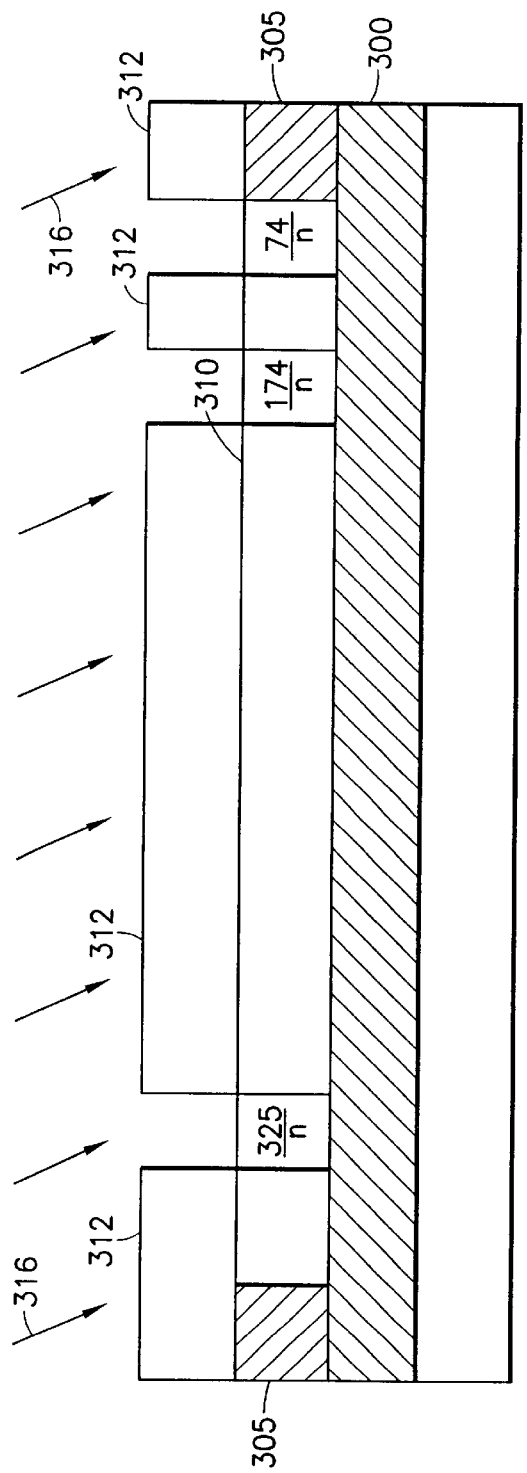
Figure 18:
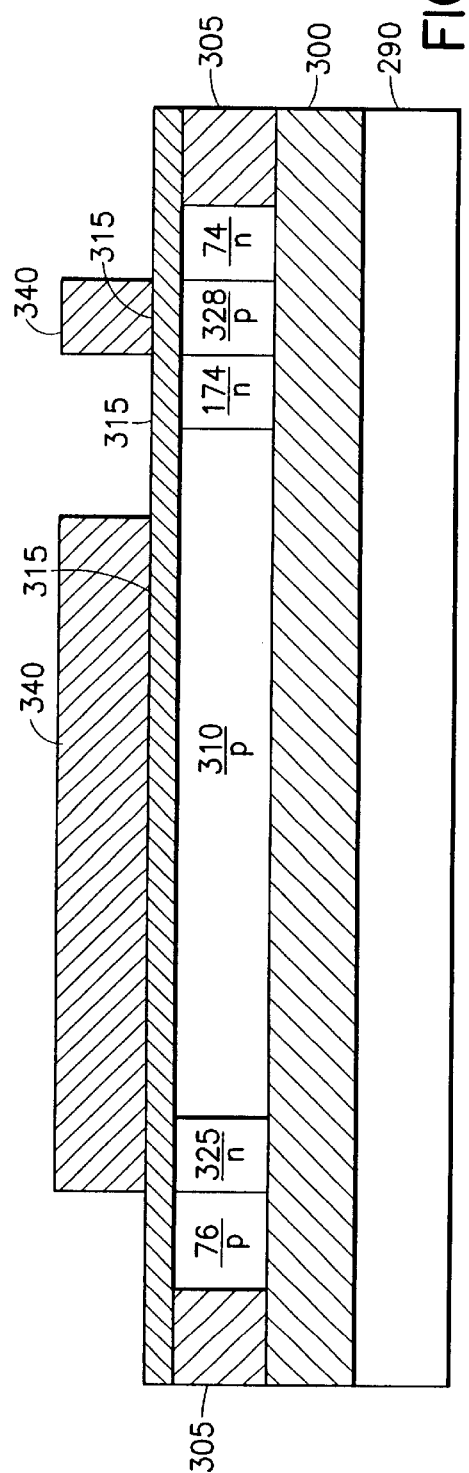
Figure 19:
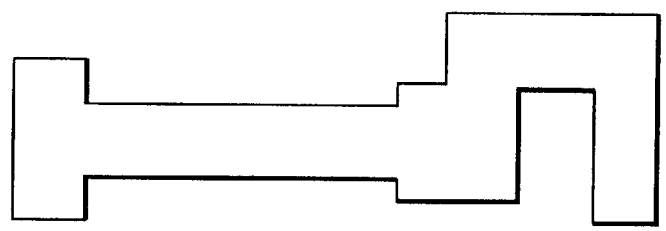
Figure 20:
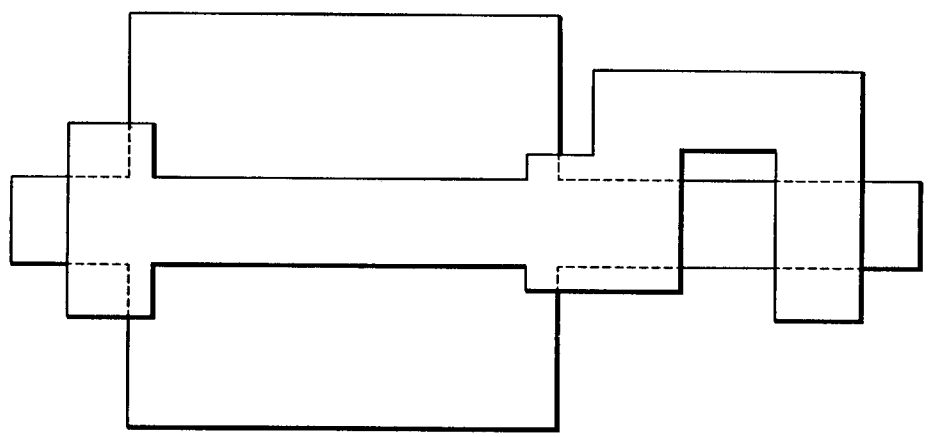
Figure 21:
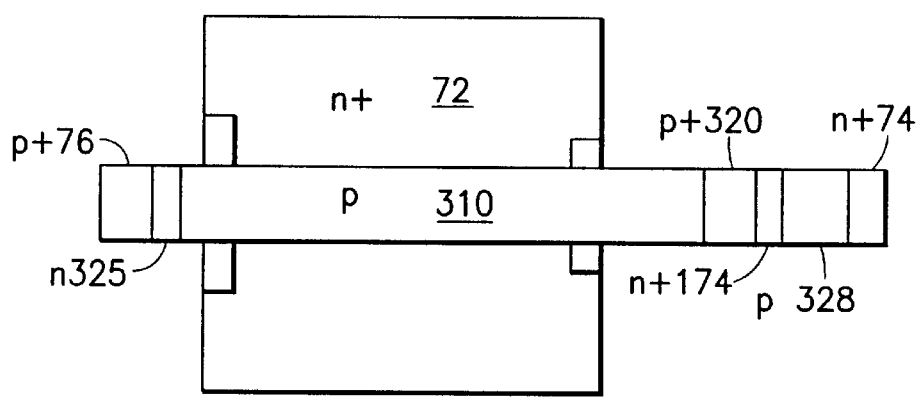

FIG. 17 shows a side view of the next step in the fabrication wherein standard VLSI processes are employed to define a photoresist mask 312 and implant N well dopants 316 into silicon layer 310. Then another photoresist mask is defined and P well dopants are implanted in silicon layer 310 to produce the structure shown FIG. 18. FIG. 18 also illustrates the next process step wherein a gate oxide layer 315 is grown and a gate polysilicon layer 340 is deposited and etched. Top views of the fabrication of the structure are shown in FIGS. 19, 20 and 21.

Figure 22:
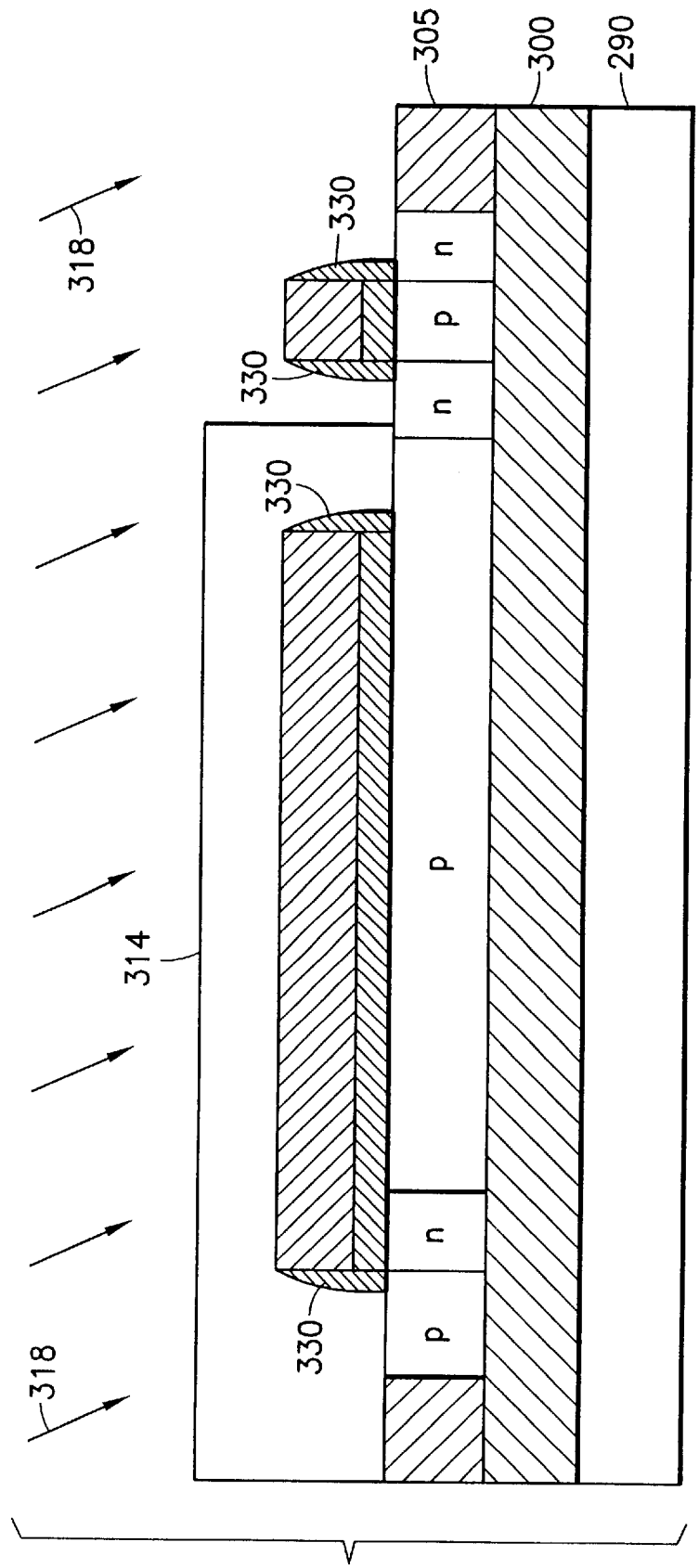

Next, in FIG. 22, spacers 330 are deposited and etched, a photoresist mask 314 is defined and the structure is implanted with dopants 318 to form n+ source drain extension, after which step a second photoresist mask and implant is used to form P+ source drain extension.

Figure 23:
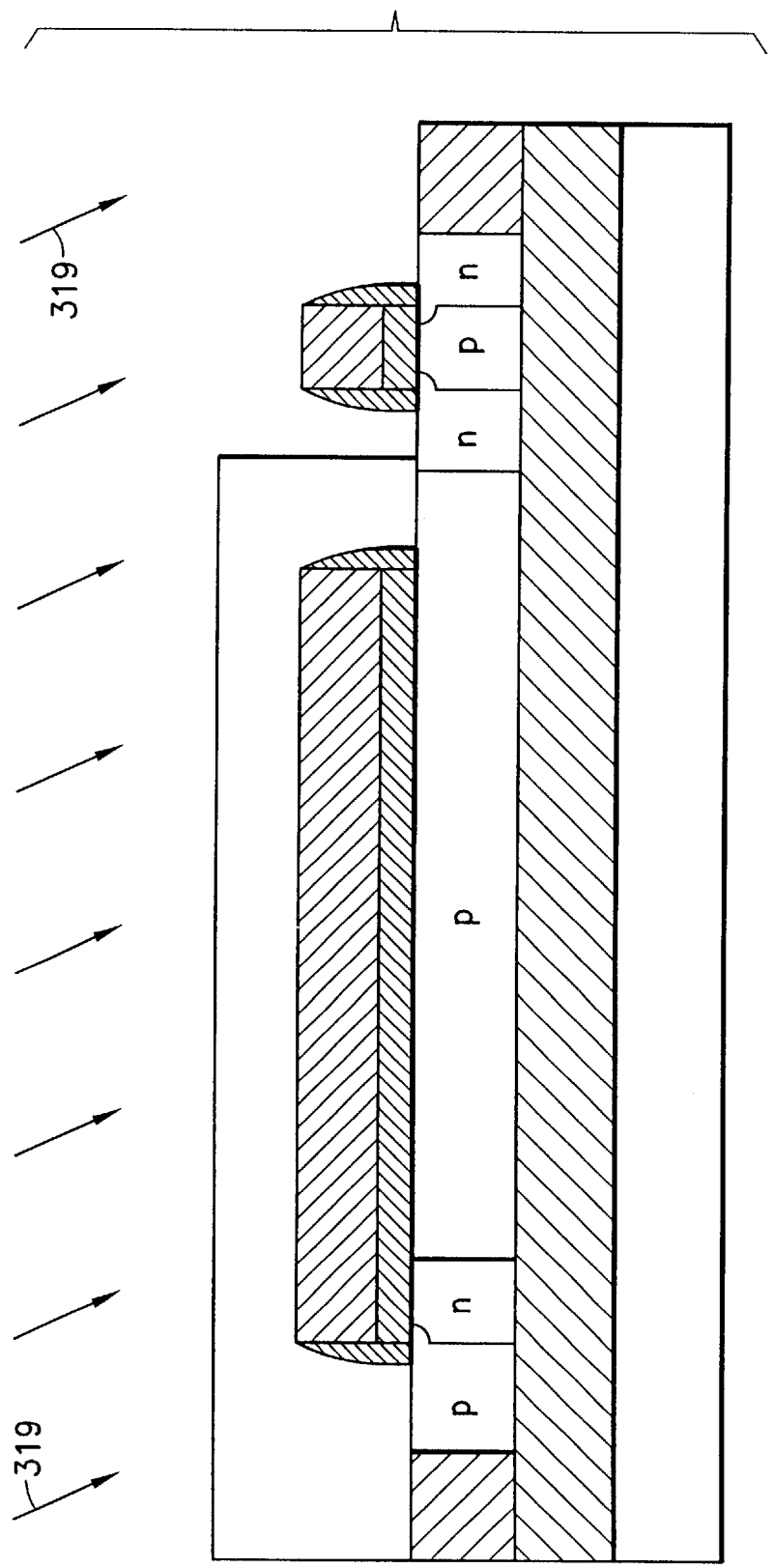

This is followed, as shown in FIG. 23, by depositing and etching the source/drain spacers, masking and implanting the n+ source and drain dopants, and then again masking and implanting the p+ source and drain dopants to produce the devices shown in FIG. 25. Note also the top view of the structure at this point as shown in FIG. 24.

In FIG. 24 the same reference numbers are used that were employed for FIG. 10. In FIG. 24, transistor 60 includes a polysilicon gate region 68, an n+ source region 72, and an n+ drain region 70. A p body region (not seen) exists under gate region 68 and is shown and labeled 310 in FIG. 25. Transistor 66 of FIG. 10 is shown in FIG. 24 and includes a gate region 80, a p+ source region 76, a p drain region (not seen) but shown as 310 in FIG. 25 (the same as the body region 310 of transistor 60) and an n body region under gate region 80 (not seen) but shown and labeled 325 in FIG. 25.

Transistor 64 of FIG. 10 is shown in FIG. 24 and includes a gate region 78, an n+ source region 74, an n+ drain region 174 and a body region (not seen) but shown and labeled 328 in FIG. 25.

Finally, as shown in FIG. 25, silicide 321, 350, 360 and 370 is formed on the structure and the device is completed using standard VLSI processing steps.

In FIG. 25 the side view of the device shows transistors 60, 64, and 66 of FIG. 10 including a gate region 80, a p+ source region 76, a p drain region 310 (which is the same as the body region of transistor 60), and an n body region 325. Oxide layer 300 is shown beneath the p type layers 310 and 328, p+ doped regions 76, 320, n+ doped regions 74 and 174, the oxide spacers 330, the polysilicon gates 340 and silicide connections 350 and 360 to Vref1 and Vref2 respectively What has been described is a switched body SOI CMOS circuit having an FET device that is switched between two threshold voltage states by changing the body bias and wherein the gate terminal of an FET controls the connection of the body bias to the FET body.

The described switched body SOI transistor unit cell devices of the present invention have a low threshold voltage level in the active switching state and a high threshold voltage level in the standby state and the source-body voltage is controlled separately during different operating regimes.

The transistor unit cells of the present invention can be integrated into logic and shift register applications to provide fast, low power alpha particle insensitive circuits.

Figure 26:
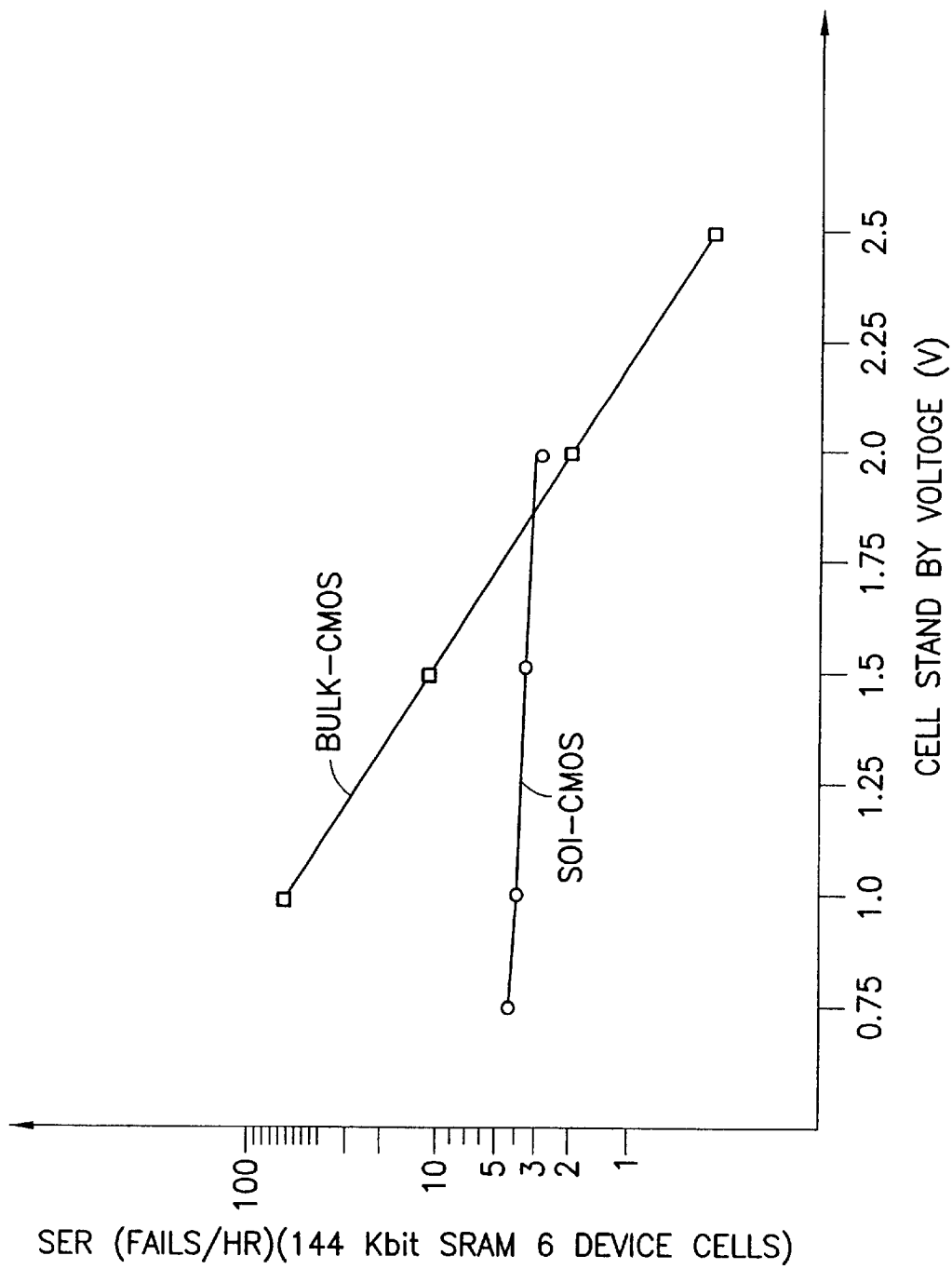
FIG. 26 is an illustration of the soft error rate of a unit cell according to the present invention compared with the soft error rate of a unit cell according to the prior art.

Referring to FIG. 26, an illustration is provided showing the relationship of the SER of a prior art bulk CMOS unit cell device with respect to cell stand by voltage and the relationship of the SER of an SOI-CMOS unit cell device with respect to cell stand by voltage. FIG. 26 shows that for operation below 1.75 volts the SOI-CMOS unit cell of the present invention provides better SER sensitivity.

While the invention has been described in connection with certain elements in its preferred embodiments and with respect to a preferred sequence of process steps in its method claims, it is not intended to limit the scope of the invention to the particular form set forth, but on the contrary, it is intended to cover all alternatives, modifications, variation in sequence of fabrication steps and equivalences as may be included within the spirit and scope of the invention as defined in the appended claims.

What is claimed is:

1. A complementary pass gate logic circuit including a plurality of switched body SOI unit cells comprising:

at least four switched body SOI unit cells each including at least two FET devices with the gate of one FET device connected to the gate of a second FET device;

a first logic signal A input means connected to a first one of said switched body SOI unit cells;

a second logic signal B input means connected to said first one and to second and a third ones of said switched body SOI unit cells;

a third logic signal NOT A input signal means connected to said third switched body SOI unit cell;

a fourth logic signal NOT B input means connected to said second and to a fourth one of said switched body SOI unit cells;

a first inverter buffer circuit connected to the output of said first and second switched body SOI unit cells to provide a NOT Q=(NOT A)×(NOT B) output logic signal; and a second inverter buffer circuit connected to the output of said third and fourth switched body SOI unit cells to provide a Q=(A)×(B) output logic signal.

2. A circuit according to claim 1 wherein said switched body SOI unit cells include a first SOI FET having a gate connected to an input for receiving an input signal and for turning on and off in response thereto;

a second FET having a gate and diffusion regions, the gate of the second FET being connected to the input for receiving the input signal, one of the diffusion regions of the second FET being connected to a body of the first FET;

a voltage terminal having a voltage level, another of the diffusion regions of the second FET being connected to the voltage terminal for connecting the voltage level to the body of the first FET for adjusting a voltage threshold of the first FET in response to the input signal simultaneously with said turning on and off.

3. The circuit of claim 1 wherein said first and second FETs are enhancement mode FETs.

4. A circuit according to claim 1 wherein said four switched body SOI unit cells include a first SOI FET device having a body, and gate, source and drain electrodes connected to said body;

at least one source of body bias voltage;

at least one switching means connected between said body of said FET device and said at least one source of body bias voltage for selectively connecting said body bias voltage to said FET device for adjusting a threshold voltage level of said FET device;

and means for connecting said at least one switching means to said gate electrode of said FET device for controlling the at least one switching means for connecting said body bias voltage to said FET body.

5. The circuit of claim 4 wherein said at least one switching means is an FET switch having source, drain and gate electrodes wherein said connecting means connects said gate electrode of said FET switch to said gate electrode of said SOI FET device for turning said FET switch on and off.

6. The circuit of claim 5 wherein said SOI FET device is a NFET.

7. The circuit of claim 5 wherein said SOI FET device is a PFET.

8. The circuit of claim 5 wherein said FET switch connects said body bias voltage to said SOI FET device to lower the threshold voltage of said SOI FET device.

9. The circuit of claim 5 wherein said FET switch connects said body bias voltage to said SOI FET device to raise the threshold voltage of said SOI FET device.

10. A circuit according to claim 1 wherein said switched body SOI unit cells include a first-type FET device having a gate coupled to an input for receiving an input signal;

a second-type FET device having a gate coupled to said input for receiving said input signal, and coupled to the body of said first-type FET device for adjusting in a first direction a voltage threshold of said first-type FET device in response to said input signal; and a second, first-type FET device having a gate coupled to said input for receiving said input signal and coupled to said body of said first, first-type FET device for adjusting in a second direction said voltage threshold of said first, first-type FET device in response to said input signal.

* * * * *